(12) United States Patent
Escamilla et al.

(10) Patent No.: US 11,812,567 B2
(45) Date of Patent: Nov. 7, 2023

(54) HANDLE ASSEMBLY WITH SLAM LATCH FOR INFORMATION HANDLING RESOURCES

(71) Applicant: Dell Products L.P., Round Rock, TX (US)

(72) Inventors: Eduardo Escamilla, Round Rock, TX (US); Sean P. O'Donnell, Poughkeepsie, NY (US); John Donachy, Austin, TX (US); Juan M. Gonzalez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 137 days.

(21) Appl. No.: 17/221,142

(22) Filed: Apr. 2, 2021

(65) Prior Publication Data
US 2022/0322552 A1    Oct. 6, 2022

(51) Int. Cl.
*H05K 5/02*    (2006.01)
*H05K 7/14*    (2006.01)

(52) U.S. Cl.
CPC ......... *H05K 5/0221* (2013.01); *H05K 5/023* (2013.01); *H05K 7/1401* (2013.01)

(58) Field of Classification Search
CPC ..... H05K 5/0221; H05K 5/023; H05K 7/1401
See application file for complete search history.

(56) References Cited

U.S. PATENT DOCUMENTS 8,369,077 B2 * 2/2013 Peng ................. G06F 1/187
361/679.33
2020/0090706 A1 * 3/2020 Yeh ..................... G11B 33/022

* cited by examiner

*Primary Examiner* — Imani N Hayman
*Assistant Examiner* — Hung Q Dang
(74) *Attorney, Agent, or Firm* — Jackson Walker L.L.P

(57) ABSTRACT

A handle assembly may include a base, a handle rotably coupled to the base via a hinge, the handle comprising a lock integral to the handle and mechanically coupled to a remainder of the handle via a spring having a spring force that biases the lock in a locked position relative to the handle. The base may include a mechanical retention feature for receiving and mechanically retaining an information handling resource. The base may also include one or more features configured to, as the handle is translated into a closed position relative to the base, mechanically engage with the lock to overcome the spring force that biases the lock in a locked position and allows the lock to return to the locked position in order to maintain the handle in the closed position.

8 Claims, 7 Drawing Sheets

HANDLE ASSEMBLY WITH SLAM LATCH FOR INFORMATION HANDLING RESOURCES

TECHNICAL FIELD

The present disclosure relates to modular information handling systems. More specifically, embodiments of the disclosure provide systems and methods for a handle assembly with a slam latch for use with a modular information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays are typically accessed from a side of the chassis in which the information handling resources may be added or removed.

It is desirable in most instances to provide users (e.g., information technology technicians or administrators) a convenient way to insert and remove information handling resources from a chassis. For instance, when a user desires to remove an information handling resource from a chassis, a mating force between electrical connectors on the information handling resource and within the chassis, along with other mechanical forces (e.g., friction between the chassis and the information handling resource) must be overcome for removal. However, due to height and size restrictions of many information handling resources and associated chassis slots, it is often difficult to provide sufficient mechanical advantage for easy removal. Such is particularly true for devices with smaller form factors, such as solid state drive (SSD) form factors, for example devices having an Enterprise & Datacenter SSD Form Factor (EDSFF).

SUMMARY

In accordance with the teachings of the present disclosure, the disadvantages and problems associated with traditional approaches to insertion and removal of modular information handling resources in a chassis have been substantially reduced or eliminated.

In accordance with embodiments of the present disclosure, a handle assembly may include a base, a handle rotably coupled to the base via a hinge, the handle comprising a lock integral to the handle and mechanically coupled to a remainder of the handle via a spring having a spring force that biases the lock in a locked position relative to the handle. The base may include a mechanical retention feature for receiving and mechanically retaining an information handling resource. The base may also include one or more features configured to, as the handle is translated into a closed position relative to the base, mechanically engage with the lock to overcome the spring force that biases the lock in a locked position and allows the lock to return to the locked position in order to maintain the handle in the closed position.

In accordance with embodiments of the present disclosure, a method for forming a handle assembly may include rotatably coupling a handle to a base via a hinge, the handle comprising a lock integral to the handle and mechanically coupled to a remainder of the handle via a spring having a spring force that biases the lock in a locked position relative to the handle. The base may include a mechanical retention feature for receiving and mechanically retaining an information handling resource. The base may also include one or more features configured to, as the handle is translated into a closed position relative to the base, mechanically engage with the lock to overcome the spring force that biases the lock in a locked position and allows the lock to return to the locked position in order to maintain the handle in the closed position.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
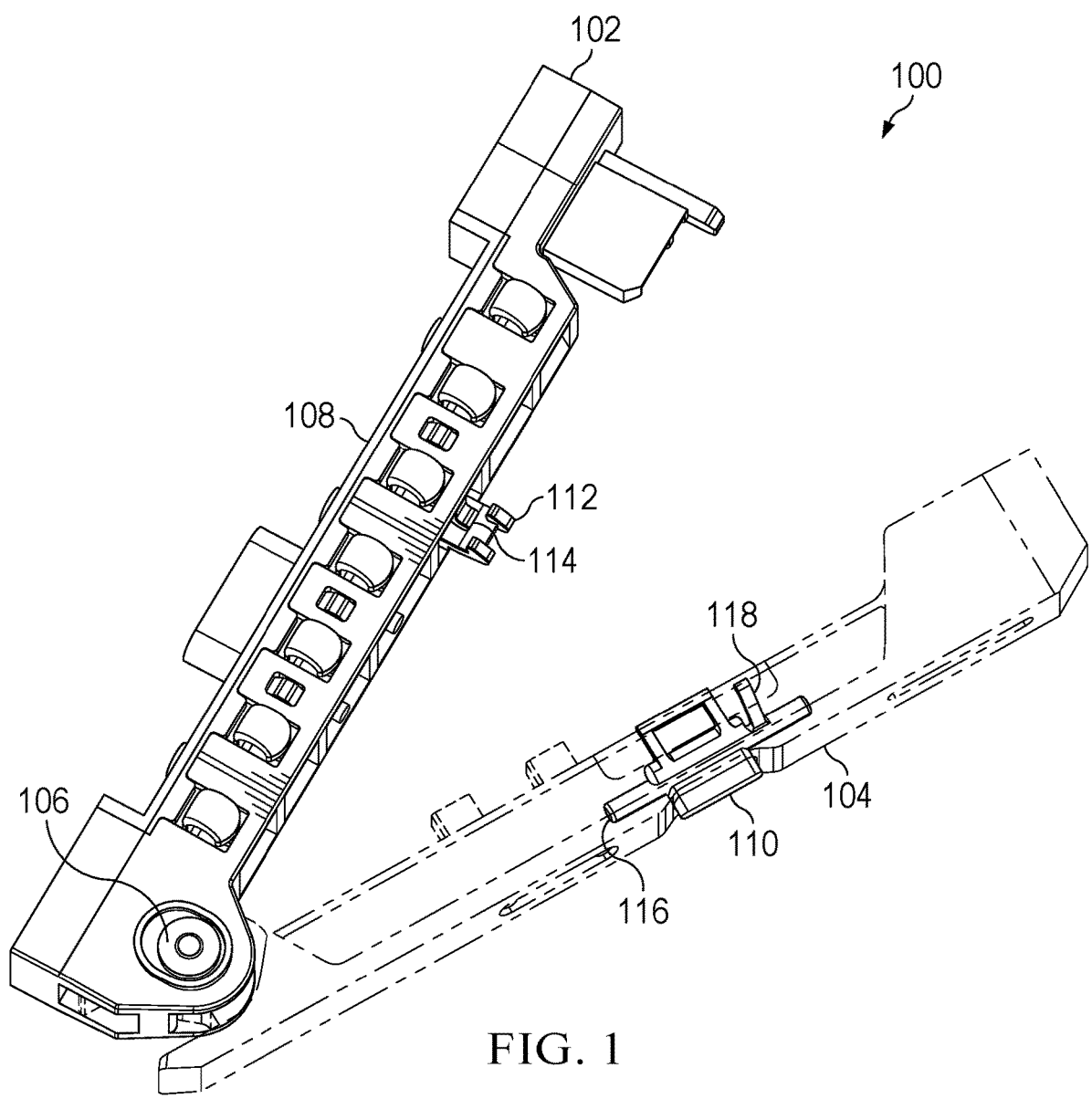
FIG. 1 illustrates a perspective view of an example handle assembly, in accordance with embodiments of the present disclosure.

FIG. 1 illustrates a perspective view of an example handle assembly 100, in accordance with embodiments of the present disclosure. As shown in FIG. 1, handle assembly 100 may include a base 102 and a handle 104 rotatably coupled to base 102 via a hinge 106. As also shown in FIG. 1, base 102 may include a retention feature 108 configured to receive and mechanically retain therein an information handling resource (e.g., an EDSFF device or other form factor device). Mechanisms for retention of an information handling resource within retention feature 108 are beyond the scope of this disclosure.

As further depicted in FIG. 1, a rotating lock 110 may be rotatably coupled to a corresponding feature of handle 104 via an axis 116 perpendicular to the rotational axis of hinge 106. Further, rotating lock 110 may be mechanically coupled to handle 104 via a spring 118 having a spring force configured to maintain rotating lock 110 in a locked position relative to handle 104. In addition, rotating lock 110 may be, as shown in FIG. 1, an integral part of handle 104 such that axis 116 remains fixed relative to handle 104.

As additionally depicted in FIG. 1, base 102 may also include, along an edge of base 102 opposite to that of retention feature 108, a ramp feature 112 and a hold feature 114 for mechanically retaining a corresponding feature of rotating lock 110, as described in greater detail below.

In operation, when inserting an information handling resource retained within retention feature 108 into an information handling system, a user may use handle 104 in an open position (e.g., an angle between base 102 and handle 104 is substantially non-zero) to provide mechanical advantage for insertion of the information handling resource. Once the information handling resource is engaged with its corresponding slot, bay, or other receptacle, the user may translate handle 104 to a closed position (e.g., an angle between base 102 and handle 104 is zero or approximately zero), at which point rotating lock 110 may engage with ramp feature 112 and hold feature 114 in order to maintain handle 104 in the closed position. When a user desires to remove the information handling resource from the information handling system, the user may disengage rotating lock 110 from ramp feature 112 and hold feature 114 as described in greater detail below, and a torsion spring (e.g., torsion spring 304 depicted in FIG. 3C below) may force handle 104 into the open position, allowing the user to grip handle 104 in order to provide the user a mechanical advantage in removing the information handling resource from the information handling system.

Figure 2A:
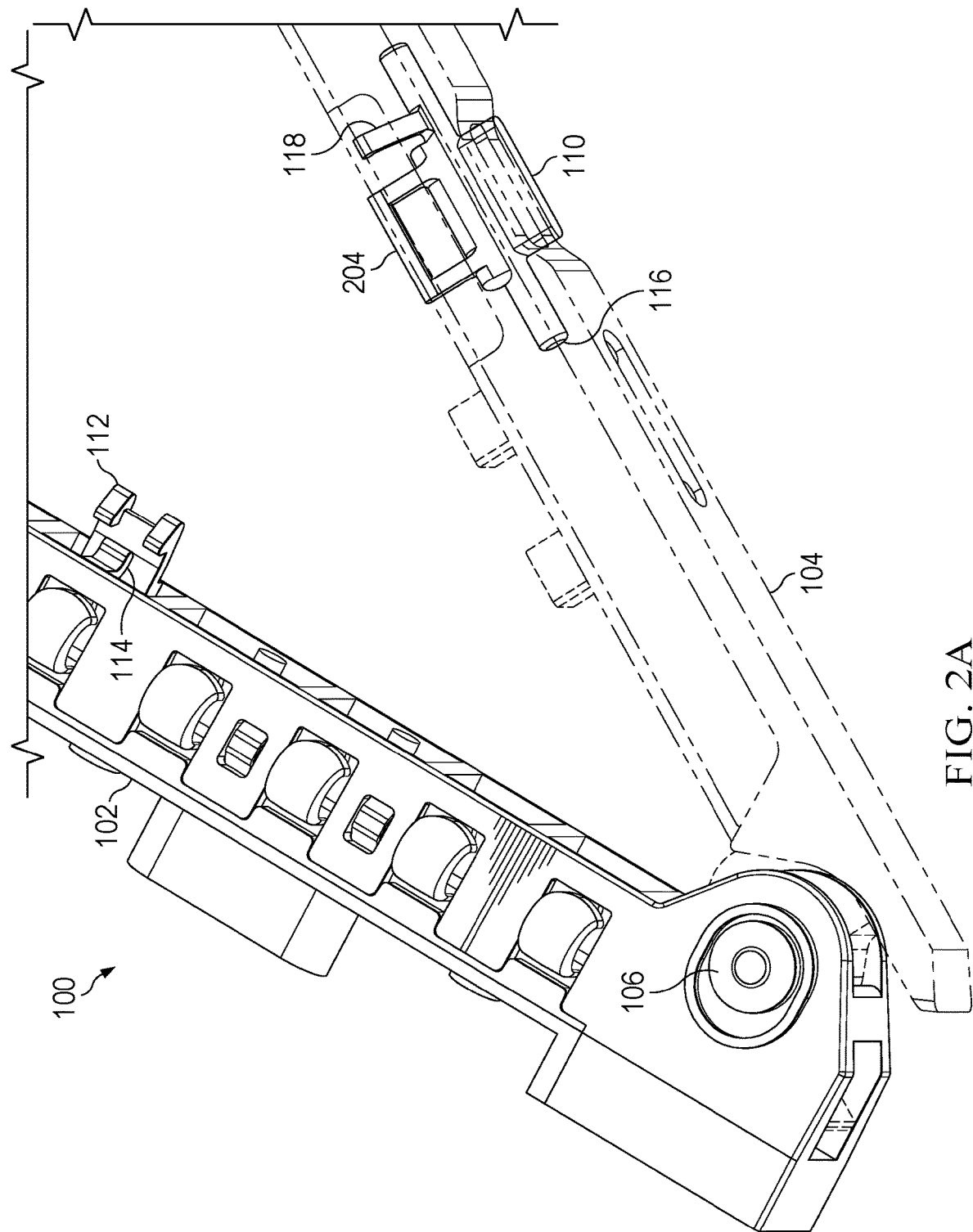
FIGS. 2A-2D illustrate perspective views of selected portions of the example handle assembly of FIG. 1, depicting closing and locking of the handle assembly, in accordance with embodiments of the present disclosure.
Figure 2B:
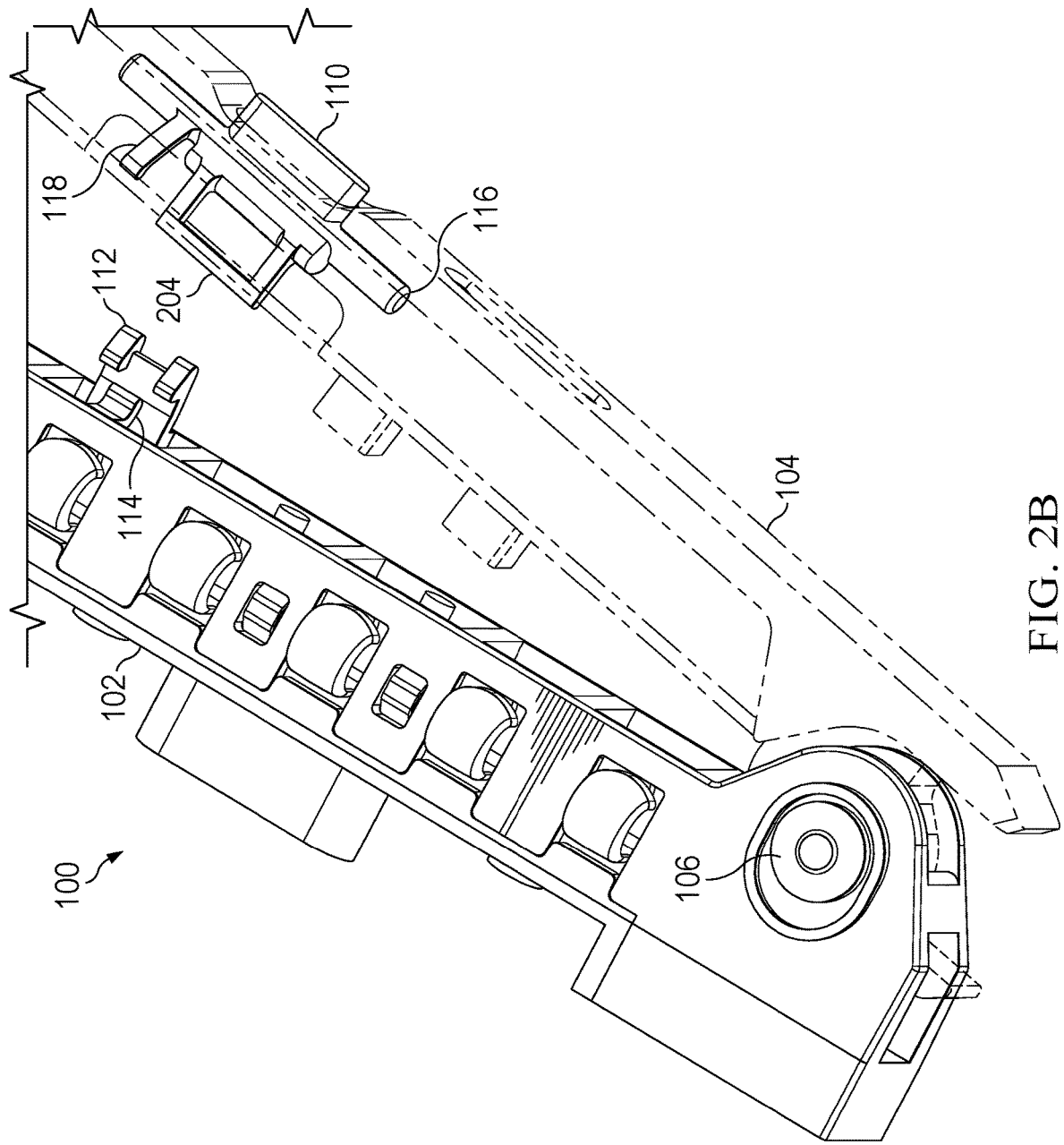
Figure 2C:
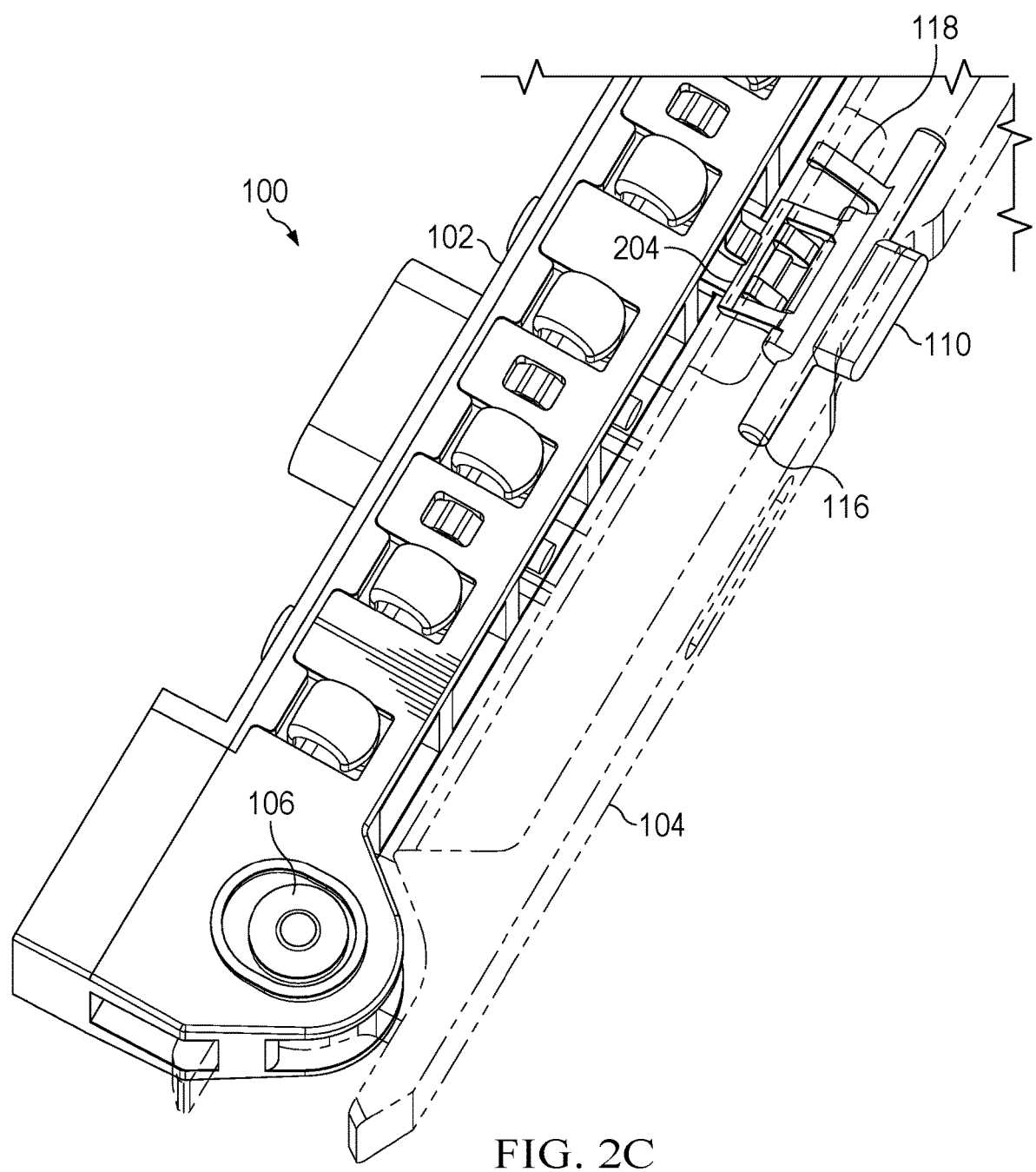
Figure 2D:
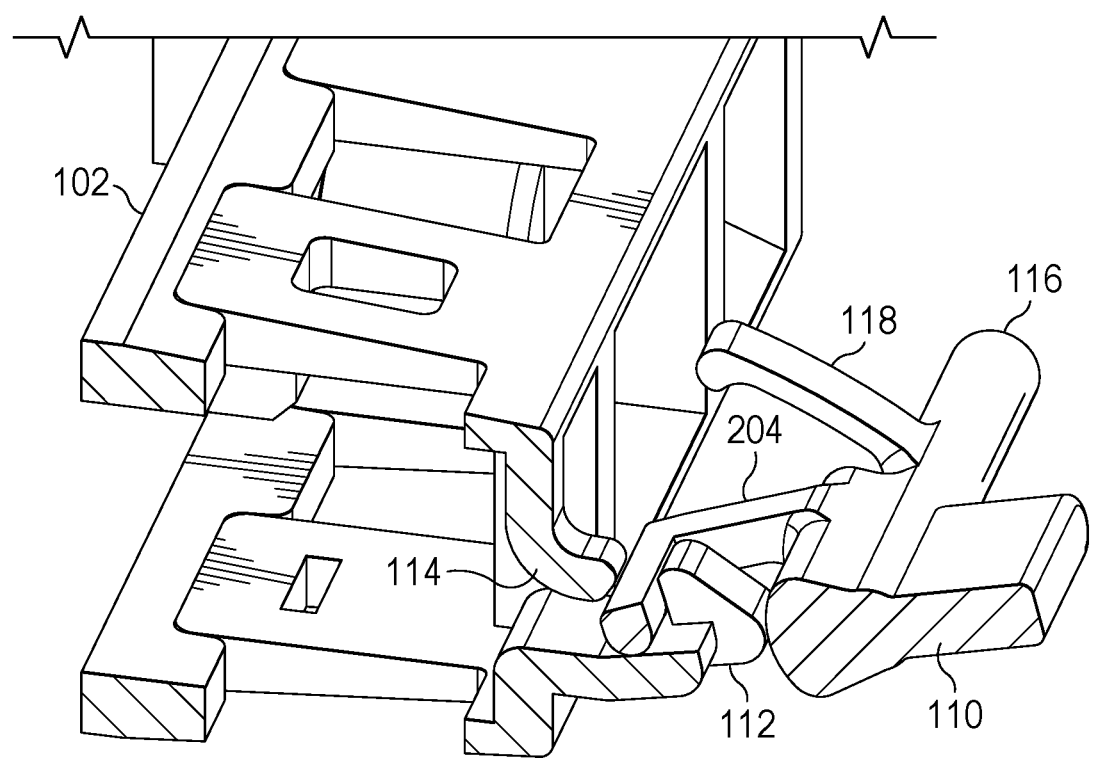

FIGS. 2A-2D illustrate perspective views of selected portions of the example handle assembly 100 of FIG. 1, depicting closing and locking of the handle assembly 100, in accordance with embodiments of the present disclosure. In particular, FIGS. 2A, 2B, and 2C illustrate a progression of handle 104 from the open position to the closed position, while FIG. 2D illustrates a cutaway view in which certain portions of handle assembly 100 are removed to depict detail of engagement of rotating lock 110 with ramp feature 112 and hold feature 114.

As described above, a spring 118 mechanically coupling rotating lock 110 to handle 104 mechanically biases rotating lock 110 in a locked position relative to handle 104. However, as a user translates handle 104 relative to base 102 between the position shown in FIG. 2A to the position shown in FIG. 2B, an engagement feature 204 of rotating lock 110 may engage with ramp feature 112, causing rotating lock 110 to overcome the spring force of the a spring 118 mechanically coupling rotating lock 110 to handle 104 such that rotating lock 110 rotates from the locked position relative to handle 104. As the user translates handle 104 relative to base 102 between the position shown in FIG. 2B to the position shown in FIG. 2C, the engagement feature 204 may pass over the top of ramp feature 112, after which the spring force of the spring 118 mechanically coupling rotating lock 110 to handle 104 forces rotating lock 110 back into the locked position relative to handle 104, such that engagement feature 204 rests in a "cradle" formed by ramp feature 112 and hold feature 114 in order to mechanically retain handle 104 in the closed position relative to base 102.

Figure 3A:
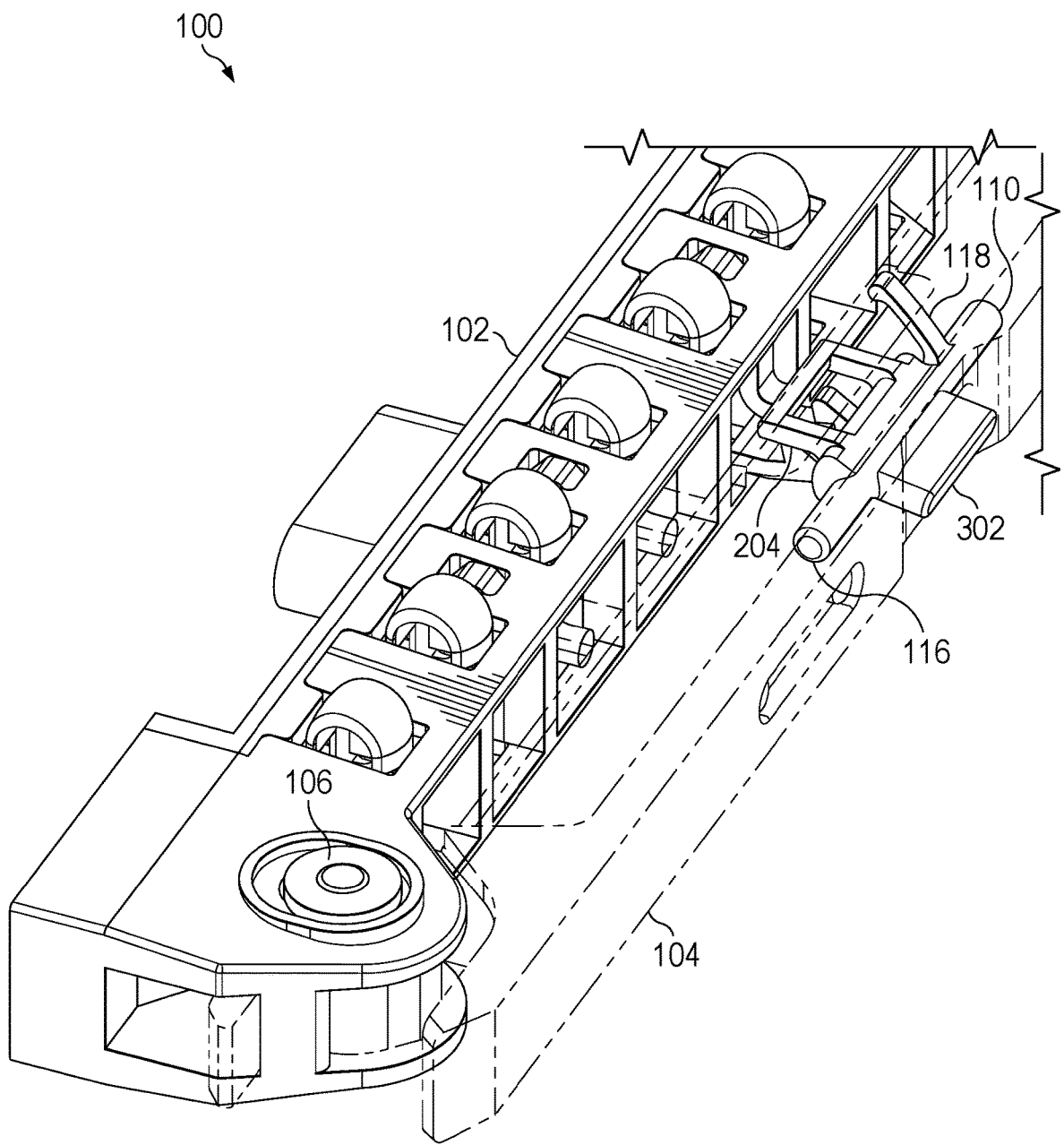
FIGS. 3A-3C illustrate perspective views of selected portions of the example handle assembly of FIG. 1, depicting unlocking and opening of the handle assembly, in accordance with embodiments of the present disclosure.
Figure 3B:
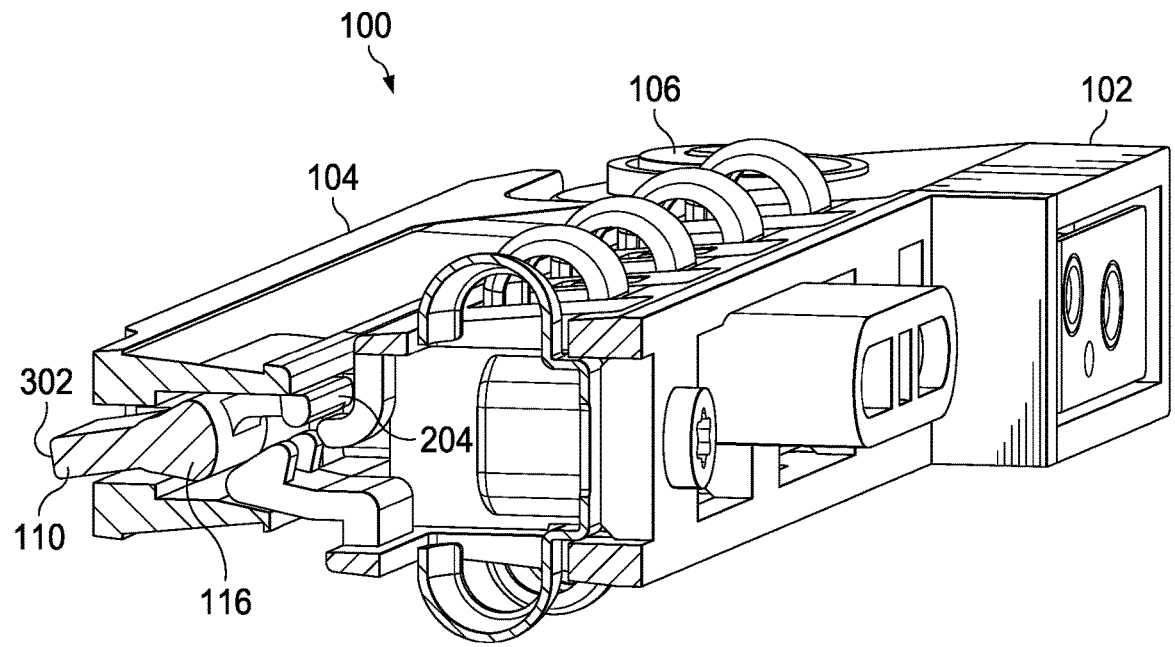
Figure 3C:
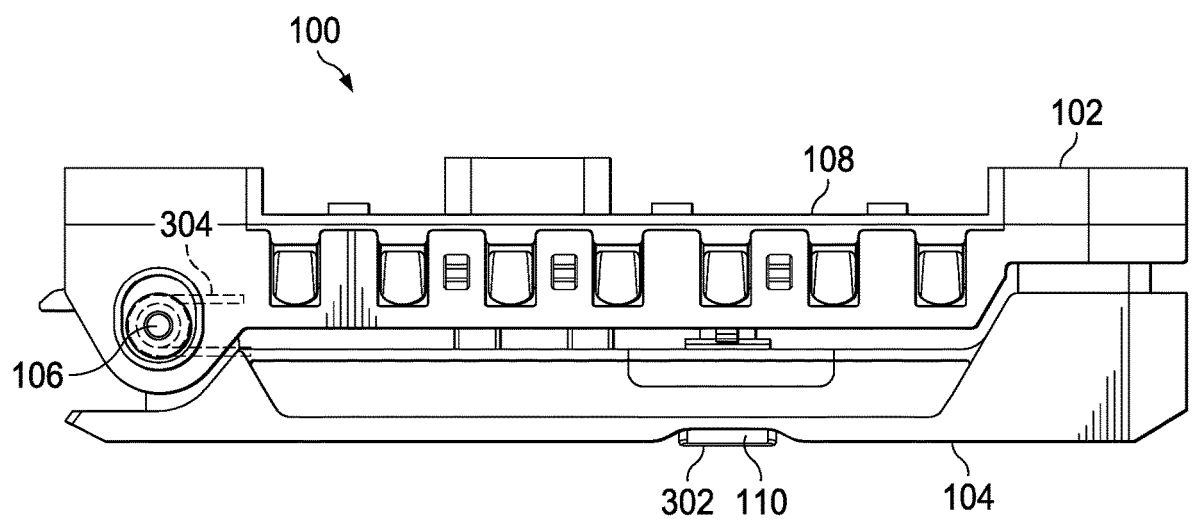

FIGS. 3A-3C illustrate various perspective views of selected portions of the example handle assembly 100 of FIG. 1, depicting unlocking and opening of the handle assembly 100, in accordance with embodiments of the present disclosure. In particular, FIG. 3A illustrates handle 104 in the closed position, FIG. 3B illustrates a cutaway perspective view in which certain portions of handle assembly 100 are removed to depict detail of disengagement of rotating lock 110 from ramp feature 112 and hold feature 114, and FIG. 3C illustrates a top plan view of handle assembly 100.

As shown in FIGS. 3A-3C, rotating lock 110 may include a disengagement feature 302 that may extend through and partially from handle 104 via which a user may interact with rotating lock 110 to overcome the spring force of the spring mechanically coupling rotating lock 110 to handle 104, such that engagement feature 204 disengages from ramp feature 112 and hold feature 114. After engagement feature 204 disengages from ramp feature 112 and hold feature 114, a spring force of a torsion spring 304 (which may be proximate to hinge 106) may force handle 104 to the open position, allowing the user to grip handle 104 and use handle 104 to provide a mechanical advantage to remove the information handling resource maintained within retention feature 108 from an information handling system.

Among the advantages of handle assembly 100 as disclosed herein is that handle assembly 100 may provide for automatic locking of handle 104, which may be highly beneficial for compact form factors, such as ESDFF. Further, handle assembly 100 may prevent an unintentional release of a device by providing an integrated lock release mechanism in a single arm apparatus. In addition, handle assembly 100 may enable a single user action to insert and secure a device or device carrier in a fluid, single-point-of-contact manner. Moreover, handle assembly 100 may ensure that a device to which it is mechanically coupled may be fully seated and retained in an information handling system enclosure.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A handle assembly, comprising:
    a base;
    a handle rotatably coupled to the base via a hinge, the handle comprising a lock integral to the handle and mechanically coupled to a remainder of the handle via a spring having a spring force that biases the lock in a locked position relative to the handle; and wherein the base comprises:
    a mechanical retention feature for receiving and mechanically retaining an information handling resource;
    one or more features configured to, as the handle is translated into a closed position relative to the base, mechanically engage with the lock to overcome the spring force that biases the lock in a locked position and allows the lock to return to the locked position in order to maintain the handle in the closed position;
    wherein the one or more features comprise:
    a ramp feature located on an edge of the base opposite the mechanical retention feature; and a hold feature located on the edge of the base opposite the mechanical retention feature;
    wherein the ramp feature and the hold feature are arranged such that:
    as the handle is translated into a closed position relative to the base, the ramp feature mechanically engages with an engagement feature of the lock to overcome the spring force that biases the lock in a locked position; and
    the ramp feature and the hold feature allow the lock to return to the locked position in order to maintain the handle in the closed position.

2. The handle assembly of claim 1, wherein:
    the lock includes a disengagement feature configured to be acted upon by a user to disengage the lock from the one or more features; and
    the handle and the base are further mechanically coupled to one another via a second spring, such that when the disengagement feature is acted upon by the user to disengage the lock from the one or more features, a second spring force of the second spring forces the handle to an open position relative to the base.

3. The handle assembly of claim 2, wherein the second spring comprises a torsion spring.

4. The handle assembly of claim 1, wherein the lock comprises a rotating lock rotatably coupled to the handle via an axis perpendicular to a rotational axis of the hinge.

5. A method for forming a handle assembly, comprising:
    rotatably coupling a handle to a base via a hinge, the handle comprising a lock integral to the handle and mechanically coupled to a remainder of the handle via a spring having a spring force that biases the lock in a locked position relative to the handle; and wherein the base comprises: a mechanical retention feature for receiving and mechanically retaining an information handling resource;

one or more features configured to, as the handle is translated into a closed position relative to the base, mechanically engage with the lock to overcome the spring force that biases the lock in a locked position and allows the lock to return to the locked position in order to maintain the handle in the closed position;

wherein the one or more features comprise:

a ramp feature located on an edge of the base opposite the mechanical retention feature; and a hold feature located on the edge of the base opposite the mechanical retention feature; wherein the method further comprises arranging the ramp feature and the hold feature such that:

as the handle is translated into a closed position relative to the base, the ramp feature mechanically engages with an engagement feature of the lock to overcome the spring force that biases the lock in a locked position; and the ramp feature and the hold feature allow the lock to return to the locked position in order to maintain the handle in the closed position.

6. The method of claim 5, wherein:

the lock includes a disengagement feature configured to be acted upon by a user to disengage the lock from the one or more features; and the method further comprises mechanically coupling the handle and the base to one another via a second spring, such that when the disengagement feature is acted upon by the user to disengage the lock from the one or more features, a second spring force of the second spring forces the handle to an open position relative to the base.

7. The method of claim 6, wherein the second spring comprises a torsion spring.

8. The method of claim 5, wherein the lock comprises a rotating lock and the method further comprises rotatably coupling the rotating lock to the handle via an axis perpendicular to a rotational axis of the hinge.

* * * * *